United States Patent
Ogura et al.

(10) Patent No.: US 6,477,088 B2
(45) Date of Patent: Nov. 5, 2002

(54) USAGE OF WORD VOLTAGE ASSISTANCE IN TWIN MONOS CELL DURING PROGRAM AND ERASE

(75) Inventors: Seiki Ogura, Wappingers Falls, NY (US); Tomoko Ogura, Wappingers Falls, NY (US); Tomoya Saito, Tokyo (JP)

(73) Assignee: Halo LSI Design & Device Technology, Inc., Wappingers Falls, NY (US)

( * ) Notice: Subject to any disclaimer, the term of this patent is extended or adjusted under 35 U.S.C. 154(b) by 0 days.

(21) Appl. No.: 10/005,932

(22) Filed: Dec. 5, 2001

(65) Prior Publication Data

US 2002/0067641 A1 Jun. 6, 2002

Related U.S. Application Data

(60) Provisional application No. 60/251,299, filed on Dec. 5, 2000.

(51) Int. Cl.[7] .............................................. G11C 16/04
(52) U.S. Cl. ............................. 365/185.29; 365/185.28; 365/185.18
(58) Field of Search ....................... 365/185.29, 185.28, 365/185.18, 185.02, 185.27

(56) References Cited

U.S. PATENT DOCUMENTS

| | | | |
|---|---|---|---|
| 6,091,643 A | * 7/2000 | Kawakami | 365/185.11 |
| 9,795,186 | 3/2001 | Hayashi et al. | 365/185.29 |
| 6,255,166 B1 | 7/2001 | Ogura et al. | 438/257 |
| 6,388,293 B1 | 5/2002 | Ogura et al. | 257/365 |

OTHER PUBLICATIONS

E. Suzuki et al., "A Low–Voltage Alterable EEPROM with Metal–Oxide–Nitride–Oxide–Semiconductor (MNOS) Structures," IEEE Transactions on Electron Device, vol. ED–30, No. 2, Feb. 1983, pp. 122–128.

Y. Tarui et al., "Electrically Reprogrammable Nonvolatile Semiconductor Memory," IEEE Jrnl. of Solid State Circuits, vol. SC–7, No. 5, Oct. 1992, pp. 369–375.

T.Y. Chan et al., "A True Single–Transistor Oxide–Nitride–Oxide EEPROM Device," IEEE Electron Device Letters, vol. EDL–8, No. 3, Mar. 1987, pp. 93–95.

B. Eitan et al., "Can NROM, a 2 Bit, Trapping Storage NVM Cell, Give a Real Challenge to Floating Gate Cells?," Extended Abstracts, 1999 Conf. on Solid State Devices and Materials, Tokyo, 1999, pp. 522–524.

* cited by examiner

*Primary Examiner*—David Nelms
*Assistant Examiner*—David Lam
(74) *Attorney, Agent, or Firm*—George O. Saile; Stephen B Ackerman

(57) ABSTRACT

In the prior arts a twin MONOS memory erase is achieved by applying a positive bias to the bit diffusion and a negative bias to the control gate. The other word gate and substrate terminals are grounded. But the voltage of word gate channel adjacent to the control gate can dramatically influence erase characteristics and speed, due to the short control gate channel length, which is a few times of the carrier escape length. A negative voltage application onto the word gate enhances erase speed, whereas a positive channel potential under the word gate reduces erase speed. By effective biasing of the memory array, word line or even single memory cell level erase is possible without area penalty, as compared to erase blocking by triple well or physical block separations of prior art. Near F-N channel erase without substrate bias application and program disturb protection by word line voltage are also included.

32 Claims, 5 Drawing Sheets

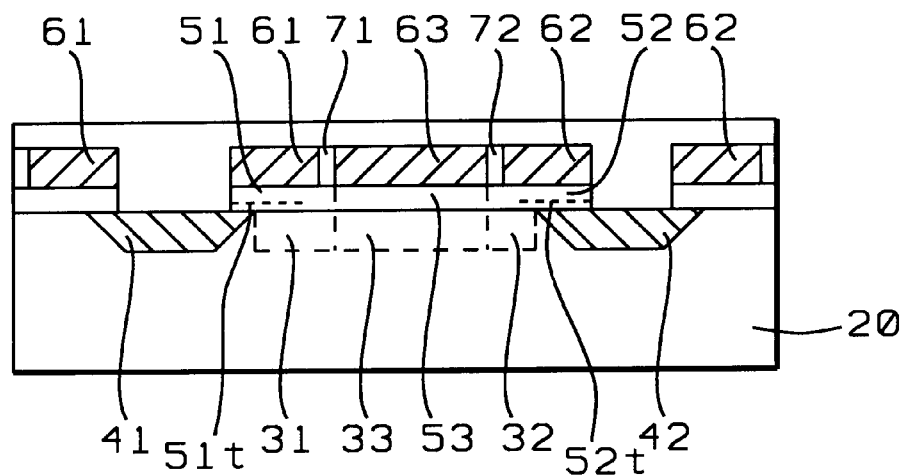
*FIG. 1 - Prior Art*
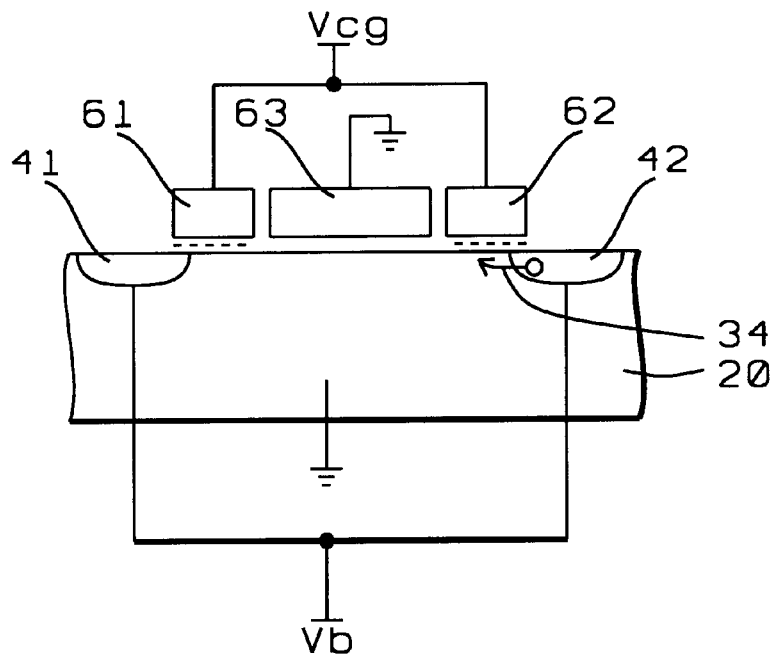
*FIG. 2a - Prior Art*

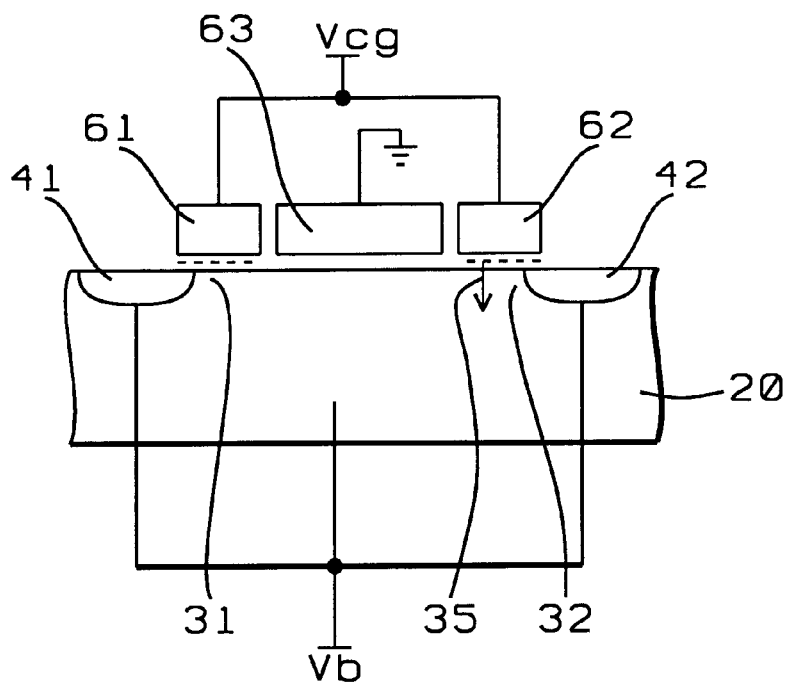
FIG. 2b – Prior Art
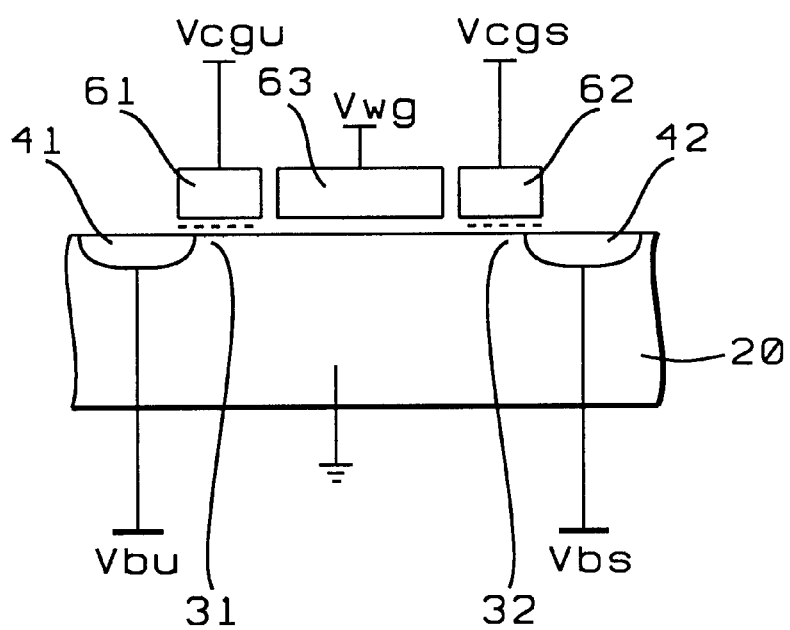
FIG. 3a

US 6,477,088 B2

USAGE OF WORD VOLTAGE ASSISTANCE IN TWIN MONOS CELL DURING PROGRAM AND ERASE

This application claims priority to Provisional Patent Application Ser. No. 60/251,299, filed on Dec. 5, 2000, which is herein incorporated by reference.

BACKGROUND OF THE INVENTION

1. Field of Invention

The present invention is related to semiconductor memories and in particular to a method of erasing nonvolatile memories.

2. Description of Related Art

Metal Oxide Nitride Oxide Semiconductor (MONOS) memories have been proposed for improving the scaling down of devices, improving reproducibility of such devices as Metal Oxide Nitride Semiconductor (MNOS), and at the same time provide a low voltage alterable device. In the MONOS devices used in nonvolatile memory cells, carrier trap sites that are located in the nitride film are used for capturing and storing carriers as electrical information.

A paper, E. Suzuki et al., "A Low Voltage Alterable EEPROM with Metal Oxide Nitride Oxide Semiconductor (MNOS) Structures", IEEE Transactions on Electron Devices, Vol. ED-30, No. 2, February 1983, p122–128, is directed to the use of direct tunnel injection of electrons into trap sites for write and erase of the electrons in the trap sites. The paper, Y. Tarui et al., "Electrically Reprogrammable Nonvolatile Semiconductor Memory", IEEE Journal of Solid State Circuits, Vol, SC-7, No. 5, October 1992, p369–375, is directed to programming single gate MONOS memories with thicker bottom oxide for better retention characteristics. In T. Y. Chan et al., "A True Single Transistor Oxide Nitride Oxide EEPROM Device", IEEE Electron Device Letters, Vol. EDL-8, No. 3, March 1987, p93–95, a single transistor device is directed toward storing electrons in the short region near the drain, wherein the channel near the source maintains the original threshold voltage, thereby eliminating the need for a select transistor. In B. Eitan et al., "Can NROM, a 2 Bit, Trapping Storage NVM Cell, Give a Real Challenge to Floating Gate Cells", Extended Abstracts, 1999 Conference on Solid State Devices and Materials, Tokyo, 1999, P522–524, an NROM concept is directed to store charge selectively in an ONO dielectric on one side of a diffusion edge, and to erase by hole injection, which is generated by band-to-band tunneling at the junction edge. A twin MONOS device structure separating ONO storage devices by a select (word) gate device while maintaining high density is given in U.S. Pat. No. 6,255,166 B1 and U.S. patent application Ser. No. 09/595,059. In the patent application Ser. No. 09/795,186, dated Mar. 1, 2001 and assigned to a common assignee, two erase methods of hole injection and F-N electron ejection are provided.

In prior art, erase is achieved by electron ejection from the ONO nitride trap sites or by hole injection into the electron trap sites, or by a combination of the two mechanisms. Hot hole injection begins when holes are created at the junction's edge, between the high voltage diffusion region and the grounded substrate. The holes then inject into the memory nitride and cancel out the trapped electron charge. Hole injection requires lower voltages than the conventional Fowler-Nordheim tunneling electron ejection. However hole injection is primarily localized to the region above the junction edge, and can not erase the entire length of the electron-trapped nitride layer. This is why prior art required a combination of hole injection and electron ejection (by F-N tunneling) for effective erase. However, the twin MONOS device of the prior art has a very short control gate memory channel length.

FIG. 1 shows a twin MONOS cell structure of prior art in which there are two N+ bit diffusion 41 & 42, above which are are two control gates 61 and 62, between which is a word gate 63. The substrate 20 is p-type, and nitride trap layers 51t & 52t store electrons for storage underneath the control gates 61 and 62. In the twin MONOS cell shown in FIG. 1, Erase is done by hole injection using band to band generation. Electrons trapped in the ONO trap sites of 51t and 52t are neutralized by injected holes, which were generated by Band to Band tunneling at N+ junction edge 41 and 42. The bias conditions are typically Vb=+4 to +5V on bit N+ diffusions 41 and 42 and Vcg=−1 to −3 volts on control gate 61 and 62 while word gate 63 is grounded as shown in FIG. 2a. The voltage requirement for hole injection across the ONO film needs to be only about 5–6 megavolts/cm. However, the threshold window is adversely affected because the heavier holes cause more damage to the oxide-insulator than electrons and create trapping sites after many program and erase cycles.

Hole injection can be reduced by reducing Band to Band hot hole generation. When the same positive potential is applied to the p substrate 20, Vb=Vsub=+4 to +5 volts as shown in FIG. 2b, as applied to the bit N+ diffusion 41 and 42, the hole generation due to band to band tunneling is suppressed. Once the potential between the substrate and the control gate voltage becomes high enough (>8–10 megavolts/cm), electrons from trapped sites (51t and 52t) are ejected into silicon 31 and 32 by means of Fowler-Nordheim (FN) tunneling. However this FN erase approach requires a triple well (p-well in an n-well on a p-substrate) to isolate each memory cell block from supporting devices during positive voltage biasing of the well. Since the triple well must be deep, the triple well isolation for each block results in significant density penalty.

In these methods, erase is determined by the control gate and bit diffusion voltages. In the cases that the memory cells are arranged such that control lines and bit lines run parallel to each other, it is necessary to divide the array either electrically by select transistors or physically with separate lines in order to define the erase block size. This array division could impact density.

SUMMARY OF THE INVENTION

It is an objective of the present invention to enhance erase speed or lower the erase voltage requirement in the twin MONOS cell, by changing the distribution of high energy holes, which are created at the junction edge under the memory control gate, through the application of a negative voltage on the word gate adjacent to the selected memory control gate.

It is also an objective of the present invention to reduce erase speed in the scaled twin MONOS cell by depleting holes under the memory control gate towards the substrate through the application of a positive voltage onto the word gate adjacent to the selected memory control gate.

It is another objective of the present invention to erase by word line in the memory array, instead of by large block size, by applying a negative voltage on the selected word gate.

It is a further objective of the present invention to inhibit erase of the cell in normal erase conditions by providing a positive word channel potential adjacent to the memory channel under the control gate by applying a positive potential to the word gate, the opposite control gate and opposite control gate diffusion.

It is yet another objective of the present invention to achieve a one cell erase (or a two cell erase) in the memory array through the selection of word gate, control gate and bit diffusion voltages.

It is also another objective of the present invention to reduce hole injection for high endurance by a F-N like erase mechanism through a positive word gate voltage, a positive word channel potential, and selecting proper word gate, control gate and bit diffusions.

It is a further objective of the present invention to use negative voltage on unselected word lines to minimize disturb during programming.

The first embodiment of the present invention provides a method to control the erase speed over a range of greater than 5 orders of magnitude by application of positive and negative voltages onto the word gate of a twin MONOS memory device where the control gate channel length of about less than 50 nm, is less than several times the hole mean free path. The twin MONOS memory cell has an extremely short control gate channel length of less than several times the electron and hole mean free path length. This ultra short memory channel length, which is the result of sidewall processing techniques, provides an erase operation that is significantly influenced by the adjacent word gate channel potential. The adjacent word gate potential directly affects the distribution of the high energy holes which are created at the junction edge under the memory control gate. The present invention makes effective usage of word gate voltage to influence the word channel potential adjacent to the control gate channel, during erase and program. It should be noted that if the control gate channel is about 100 nm or more, which is longer than several times the electron and hole mean free path length, the word channel potential will not influence the adjacent channel and the schemes provided in the present invention will not be effective.

In the second embodiment of the present invention block erase is defined by the selection of a word line. A block to be erased can be as small as a single word line, or as large as multiple word lines. The nitride trap regions underlying control gates of a selected word line and associated with negatively biased control gates are erased at the same with the application of a negatively applied voltage to a selected word line. The nitride trap regions underlying control gates of an unselected word line with a positive applied bias are not erased.

In the third embodiment of the present invention a single cell erase is provided. A single MONOS cell contains two adjacent nitride trap sites (storage sites). Both storage sites are erased on a selected word line by applying a negative voltage to the control gate associated with the two storage sites. Other storage sites sharing the same control line and bit line are not erased if the unselected word lines associated with those cells are biased with a positive voltage.

In the fourth embodiment of the present invention a slower and more reliable method of erase is provided which increases the endurance of the memory cell. This is a F-N like method of erase which uses the word line voltage. Bias of the substrate of the memory cell is not necessary. Both word lines and bit lines are raised to a positive voltage and the control gates are biased with a negative voltage. This produces a high electric field across the ONO film creating the trap sites. The voltages are selected to produce higher field than is necessary for hole injection. The hole injection at the junction is suppressed by the high word line voltage.

In the fifth embodiment of the present invention program disturb of unselected cells is improved. This is accomplished by lowering the voltage on an unselected word line to a small negative voltage. This can improve the time for disturb up to a few seconds. This improvement can also be obtained by increasing the voltage of the right adjacent bit line.

BRIEF DESCRIPTION OF THE DRAWINGS

This invention will be described with reference to the accompanying drawings, wherein:

FIG. 1 is a diagram of a Twin MONOS cell structure of prior art;

FIG. 2a shows bias conditions of prior art for a hole injection erase due to band to band tunneling at the bit diffusion edge;

FIG. 2b shows the bias conditions of prior art for a Fowler-Nordheim tunneling erase by applying the same bit voltage to the substrate;

FIG. 3a shows the bias conditions to measure the effect of word gate potential on erase characteristics by hole injection of the present invention;

DETAILED DESCRIPTION OF THE PREFERRED EMBODIMENTS

Figure 3B:
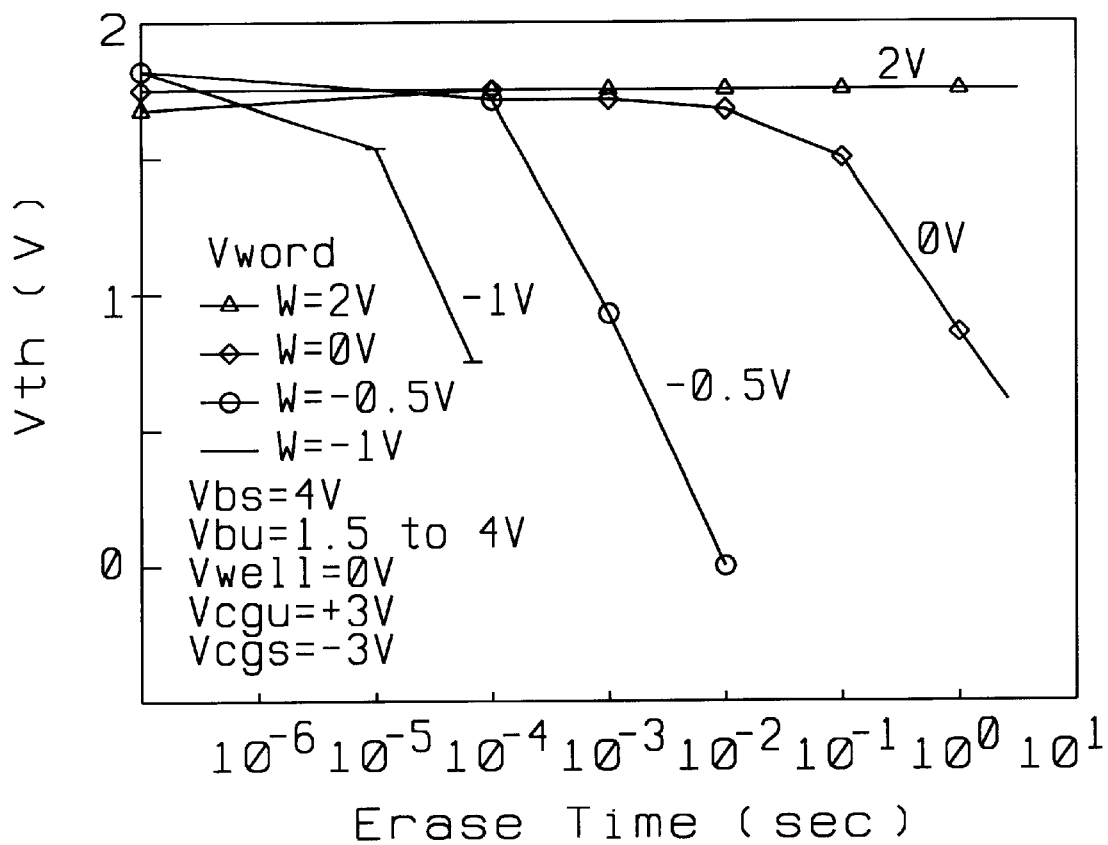
FIG. 3b shows the threshold voltage of a MONOS cell on the right control gate for various word channel conditions of the present invention.

In the memory cell cross-section of FIG. 3a, two control gates 61 and 62, adjacent to one word gate 63 are independently biased to Vcgu (left side, unselected) and Vcgs (right side, selected). Underlying the two control gates 61 and 62 are nitride trap sites 51t and 52t, respectively. The left and right bit diffusions 41 and 42 are biased to Vbu and Vbs, respectively. The right control gate 62 is the target memory element, of which the nitride trap sites in the underlying ONO are filled with electrons by CHE. During this erase experiment, the target side right control gate 62 is biased to approximately Vcgs=−3V, and the right bit diffusion 42 is biased to approximately Vbs=4V (Vbs range can be in the range of approximately 3.5 to 5V). The word gate 63 and substrate 20 are grounded. On the left, unselected side, the control gate and diffusion are biased to approximately Vcgu=4V and approximately Vbu=4V, respectively.

FIG. 3b shows threshold voltage as a function of time. Three curves for different word gate voltages are shown. All of the other voltage conditions for control gates, diffusions and substrate are fixed to Vcgu=4V, Vcgs=−3V, Vbu=4V, Vbs=4V, and Vsub=0. When Vword=0, the erase target voltage of Vt=0.5V is reached after 1 sec. Biasing the word gate to a slightly negative potential of Vword=−0.5V enhances the erase speed by almost 1000 times. This is because holes that are generated at the junction edge of the right diffusion 42 from band to band tunneling are pulled toward the word gate by the negative potential, and accumulate more under target control gate 62. Applying a further negative voltage to the word gate of −1V enhances the erase speed by more than 1000 times. On the other hand, raising the voltage of the word gate to a positive potential, Vword=2V, allows some of the voltage of the left side diffusion 41 to pass through to word gate channel edge, adjacent to the target control gate's channel. The voltage that passes through will be about Vword=2V minus the threshold of the word gate device, which is about 1V. Because the word gate voltage limits the voltage of the word gate channel, it is not actually necessary for the unselected bit line voltage to be any higher than 1V. According to the experimental data, a positive word gate channel voltage of 1V, created by application of 2V to the word gate slows down the erase speed by about 1000 times. Thus, under normal erase conditions in which the selected control gate and selected diffusion are biased to −3V and +4V, respectively, erase can be inhibited if a positive word gate voltage is effectively used in a memory cell having a very short control gate channel. Under the same normal erase applying a negative bias to the word gate for selected control gate and selected diffusion, erase can accelerate conditions. In the first embodiment of the present invention, the unselected control gate was biased to a positive voltage, Vcgu=4. By raising the unselected control gate voltage and the word gate voltage, some positive voltage is passed from the unselected diffusion side. However, even if the unselected control gate were to be biased to zero or a negative voltage, Vcgu=0 or −3V (the same as the selected control gate voltage, Vcgs), a positive word gate voltage could have the same inhibiting effect on the erase speed. By biasing the word gate to a positive voltage of around 3V to 4V, the word gate channel will capacitively couple up, providing positive potential to repel holes from the selected control gate channel.

Figure 4A:
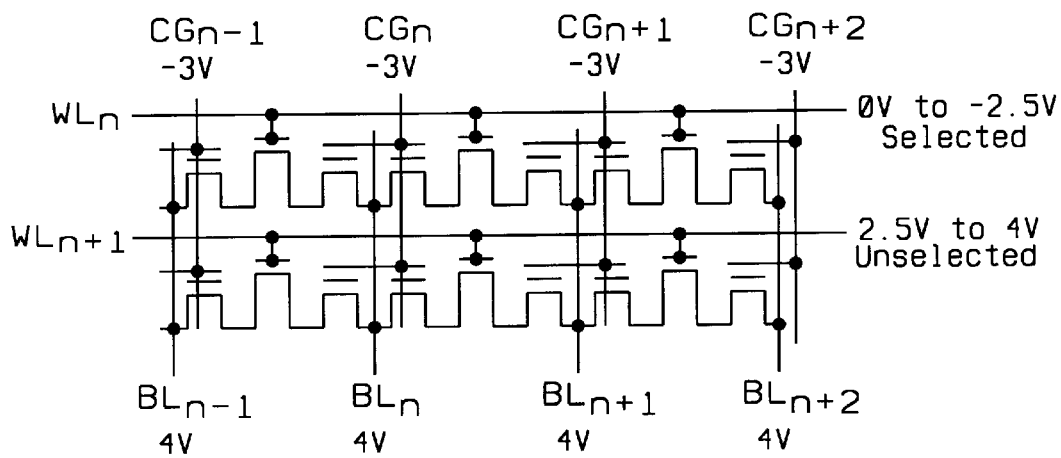
FIG. 4a shows a schematic diagram of the present invention with array voltage conditions for word line erase.

In the second embodiment of the present invention, the erase block is defined by word line selection in addition to control line and bit line selection. A twin MONOS memory cell array is shown in FIG. 4a, in which memory cells are arranged in rows and columns wherein word gates are connected horizontally by word lines, and control gates and diffusions are connected vertically by control lines and bit lines, respectively. This type of memory array is called a bit diffusion array, because the bit lines of adjacent memory cells within a single column are connected by diffusion. Within a given memory array or sub-array, the control lines are biased to approximately −3V (somewhere in the range of −2V to −4V), and the bit lines are raised to approximately 4V. However, further division is possible by word line(s) selection; a negative voltage of between approximately 0 to −2.5V is applied onto the selected word line(s) and a positive voltage of between approximately 2.5V to 4V is applied to the unselected word lines. The ONO memory film regions 51t and 52t under the control gates associated with the negatively biased word gates are erased at the same time that the positively biased word lines (2.5~4V) do not erase. Thus an erase block can be determined to be as small as a single word line or multiple word lines. Additional select gates for the control lines and bit lines are not necessary, so layout area is saved.

Figure 4B:
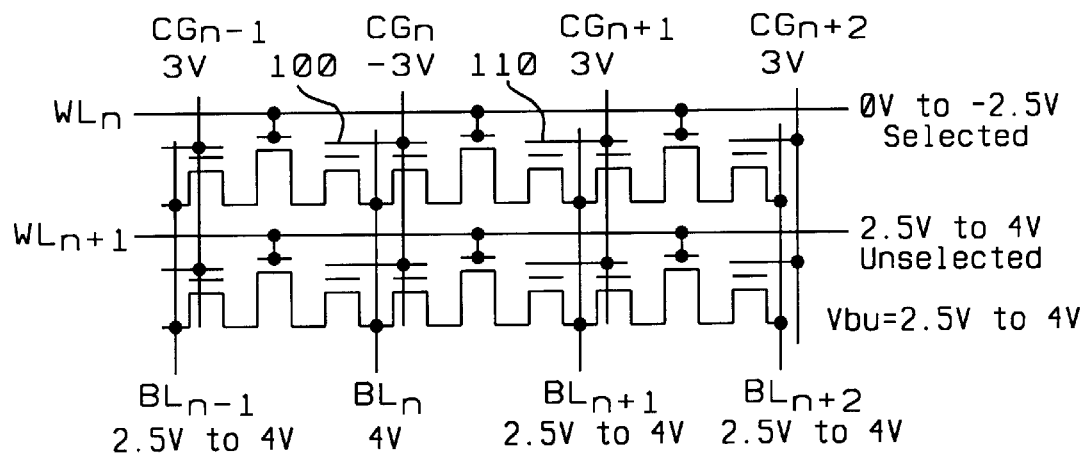
FIG. 4b shows a schematic diagram of the present invention with array voltage conditions for single pair cell erase.

The third embodiment of the present invention provides electrical single cell level erase for a bit diffusion twin MONOS memory array. In FIG. 4b, a single memory cell 100 is selected at the cross-point of the selected bit line BLn, selected control line CGn and selected word line WLn. The selected word line WLn is biased to a negative voltage (0V to −2.5V), the selected bit line BLn is biased to a positive voltage (approximately 4V) and the selected control line CGn is biased to a negative voltage approximately −3V (within the range of −2V to −4V). The other unselected memory cells sharing the same selected bit line BLn and selected control line CGn can be protected from erase (called erase inhibit) by applying a positive voltage to the unselected word lines like WLn+1. This positive voltage can be in the range of approximately 2.5V to 4V. The other unselected control lines should be biased to a positive voltage (approximately 3V), and the other unselected bit lines should be biased to a positive voltage approximately 2.5V to 5V). The unselected cells 110 with positive control gate bias are not erased because the number of holes generated by band to band is insignificant. Thus the selective bit level erase can be achieved.

Figure 4C:
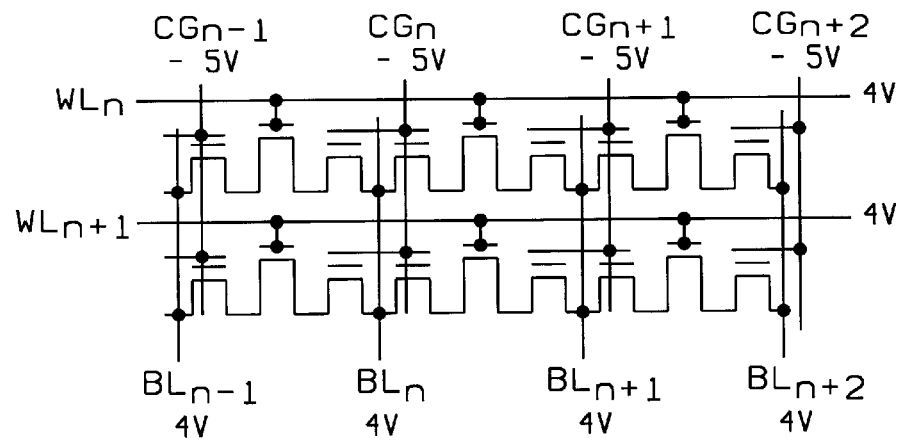
FIG. 4c shows a schematic diagram of the present invention with the array voltage conditions for FN-like block erase for better endurance.

In the fourth embodiment of the present invention a more reliable, albeit slower, F-N-like method of erase is presented as a way to increase the endurance of a memory cell. By effectively using the word line voltage, it is not necessary to bias the memory cell substrate, so a triple well is not needed and area is saved. FIG. 4c shows an example of the voltage conditions for this "nearly" F-N erase. All word lines are raised to approximately 4V, the bit lines are raised to approximately 4V, and the control lines are biased to approximately −5V to −6V. Although all of the voltages given in the present invention are approximate values and may be varied over some reasonable range, there is a significant difference in voltage values used for this "nearly" F-N erase and hole injection erase. The difference between the "nearly" F-N erase mechanism and the previously described hot hole injection erase mechanisms, is that a higher electric field is needed across the ONO film for electron ejection. About 8 megavolts/cm is needed in order for electrons to eject from the nitride traps 51t and 52t into the channel below, compared to approximately 5 to 6 megavolts/cm for hole injection. In order to suppress hole creation at the junction, the word line is raised to a positive voltage of approximately 4V, enough to capacitively couple the underneath channel voltage up, which repels holes away. As the word gate length dimension shrinks with technology scaling and the diffusion are in closer proximity to each other, the voltage under the word gate channel will be nearer to the positive drain voltages, instead of the grounded memory substrate. In this case, increasing the word gate voltage will have an even greater F-N erase effect.

Figure 5A:
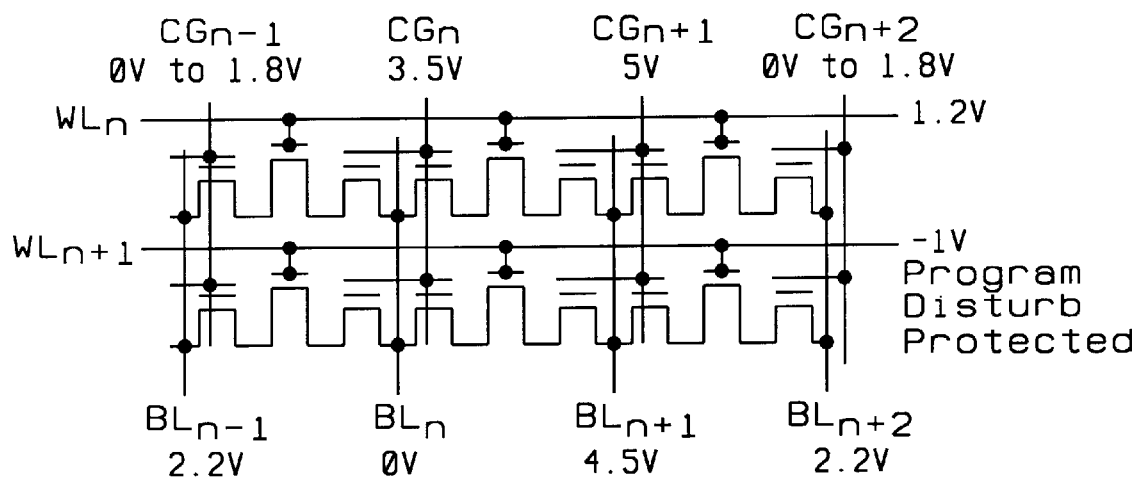
FIG. 5a shows a schematic diagram of the present invention with an unselected word line voltage condition to minimize program disturb.
Figure 5B:
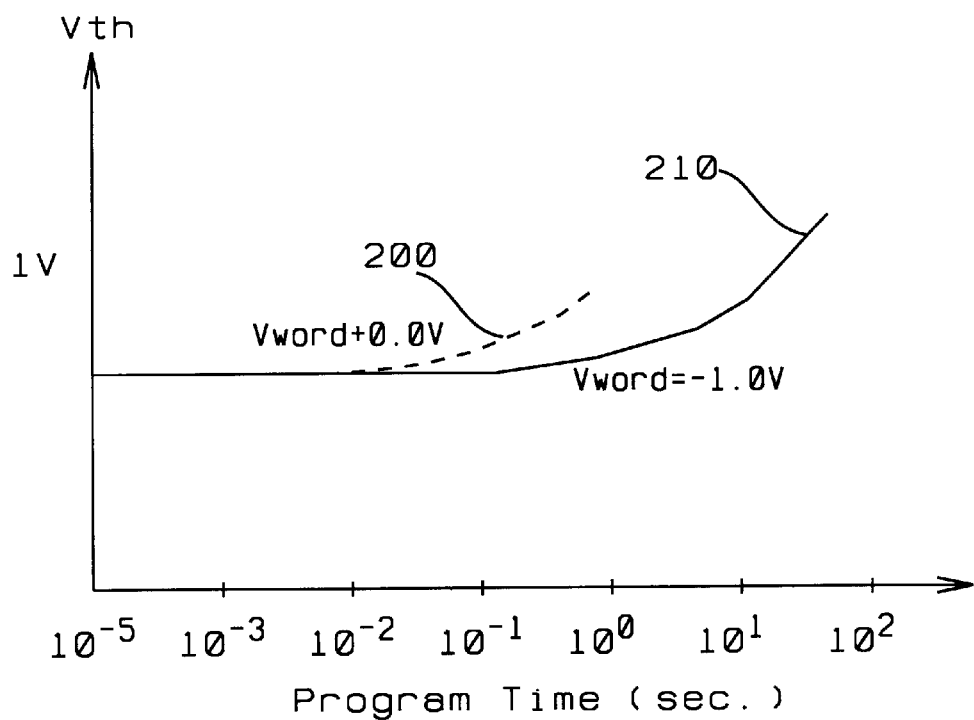
FIG. 5b shows experimental data for program disturb improvement by negative biasing of the unselected word gate.

In the fifth embodiment of the present invention, program disturb of unselected cells during program of a selected cell is improved. Shown in FIG. 5a, the program target cell is the left side device at the cross point of the selected control line CGn+1, selected bit line BLn+1, and selected word line WLn. The left adjacent bit line BLn is grounded, the selected bit line BLn+1 is biased to 4.5V, and the selected word gate WLn is raised to 1.2V, which is slightly higher than the word gate threshold voltage, in order to provide and control the programming current. An improvement in program disturb of unselected cells can be obtained by biasing the unselected word line(s) WLn+1 to a slightly negative voltage like −1V. It can be seen in FIG. 5b, that the program disturb is improved from 0.1 sec to a few seconds as a result of the negative voltage application. In order to protect the right side device of the the target control line CGn+1, which is on the same selected word line WLn, the adjacent bit line BLn+2 is raised to 2.2V. Then the gate to source voltage of the right side control gate CGn+1 becomes −1V (=1.2−2.2V). This negative Vgs voltage protects the adjacent cell from program disturb. Instead of applying a negative voltage to a word gate, the same disturb protecting effect can be obtained by slightly increasing the voltage of the right adjacent bit line BLn+1. The left side memory region underlying the same selected control gate CGn+1 can be protected from program disturb, by raising BLn−1 in this manner. The basis of program disturb improvement is that the gate to source voltage Vgs of the unselected memory cells is less than 0. Vgs can be made negative by reducing the voltage of the word line (equal to the gate voltage), or by increasing the bit line voltage (equal to the source voltage). The best voltage for the negative Vgs is determined based on factors of device, leakage, process, and circuit simplicity.

While the invention has been particularly shown and described with reference to preferred embodiments thereof, it will be understood by those skilled in the art that various changes in form and details may be made without departing from the spirit and scope of the invention.

What is claimed is:

1. A method of erase of a nonvolatile memory structured from twin MONOS cells, comprising:
    a) biasing a first conductivity region on the first side of a channel region to a first positive voltage,
    b) biasing a second conductivity region on the second side of a channel region to a second positive voltage,
    c) biasing a first conductive gate to a first negative voltage,
    d) biasing a second conductive gate to said first negative voltage,
    e) biasing a third conductive gate coupled to a selected word line to zero volts or a second negative voltage,
    f) biasing said third conductive gate coupled to a unselected word line to a fourth positive voltage,
    g) creating an electric field in an insulator under said first conductive gate of memory cells coupled to the selected word line.

2. The method of claim 1, wherein creating said electric field is of sufficient strength to eject trapped electrons from said insulator into said channel region.

3. The method of claim 1, wherein creating said electric field is of sufficient strength to inject holes from junction edge of said channel region into said insulator.

4. The method of claim 1, wherein said first conductivity region is coupled to a bit line for the selected cell.

5. The method of claim 1, wherein said second conductivity region is coupled to a bit line for the adjacent cell.

6. The method of claim 1, wherein said first and second conductive gates are control gates.

7. The method of claim 1, wherein said third conductive gate lies between and is insulated from said first and second conductive gates and is a word gate.

8. The method of claim 1, wherein biasing said third conductive gate coupled to said selected word line to a negative voltage accelerates hole injection from the junction edge of channel region of said memory cells into the insulator under said second conductive gate.

9. The method of claim 1, wherein biasing said third conductive gate coupled to said unselected word line to a positive voltage inhibits hole injection from the junction edge of channel region of said memory cells into the insulator under said second conductive gate.

10. The method of claim 1, wherein biasing said third conductive gate coupled to said selected word line to a positive voltage reduces erase speed by depleting holes under said first conductive gate.

11. The method of claim 1, wherein biasing said selected word line to a negative voltage and biasing said unselected word line to a positive voltage allows an erase block size to be said selected word line.

12. A method of single cell erase of a nonvolatile memory structured from twin MONOS cells, comprising:
    a) biasing a bit line of a selected cell to be erased to a first positive voltage,
    b) biasing a control gate of said selected cell to be erased to a first negative voltage,
    c) biasing a word gate coupled to a selected word line to a second negative voltage,
    d) biasing said word gate coupled to an unselected word line to a fourth positive voltage,
    e) creating an electric field in an insulator under said control gate of said selected cell.

13. The method of claim 12, wherein biasing said bit line of cells to be inhibited is done to a second positive voltage.

14. The method of claim 12, wherein creating said electric field is of sufficient strength to eject trapped electrons from said insulator into a channel region of said selected cell.

15. The method of claim 12, wherein creating said electric field is of sufficient strength to inject holes from a junction edge of a channel region of said selected cell.

16. The method of claim 12, wherein said word gate lies between and is insulated from a control gate of said selected cell said control gate of an adjacent unselected cell.

17. The method of claim 12, wherein biasing said unselected word line to said fourth positive voltage provides an erase inhibit for cells coupled to said unselected word lines.

18. The method of claim 12, wherein biasing said control gate of an unselected cell coupled to said selected word line to said third positive voltage provides an erase inhibit for said unselected cell coupled to said selected word line.

19. A method of improvement in program disturb of unselected cells during programming of a selected cell, comprising:
    a) selecting a left or right side to program within a selected cell,
    b) biasing a selected bit line to a first positive voltage,
    c) biasing a near adjacent bit line which is adjacent to said selected bit line to zero volts,
    d) biasing a far adjacent bit line which is adjacent on a far side of said selected cell to a second positive voltage,
    f) biasing a selected word line to a third positive voltage,
    g) biasing an unselected word line to a negative voltage,
    h) establishing a negative gate to source voltage of unselected cells.

20. The method of claim 19, wherein biasing said selected word line is made to be higher than the word gate threshold voltage to control programming current.

21. The method of claim 19, wherein biasing said unselected word line to a negative voltage provides program disturb improvement by lengthening a time required for program disturb to occur.

22. The method of claim 19, wherein biasing said selected word line to said third positive voltage and said far adjacent bit line said second positive voltage creates a negative gate to source voltage that protects the unselected side of said selected cell cell from program disturb.

23. The method of claim 19, wherein creating a negative gate to source voltage in said unselected cells produces an improvement in program disturb.

24. A word line erase means for a nonvolatile memory structured from twin MONOS memory cells, comprising:
    a) a means for selecting twin MONOS memory cells to be erased, b) a means for inhibiting from erase unselected twin MONOS memory cells, c) a means for creating an electric field under a control gate of selected twin MONOS memory cells of sufficient magnitude to eject trapped electrons from an insulator into a channel region, d) a means for creating an electric field under said control gate of the selected twin MONOS memory cells of sufficient magnitude to inject holes from the junction edge of a channel region into a trap site under the control gate.

25. The word line erase means of claim 24, wherein said electric field is of sufficient magnitude to implement Fowler-Nordheim tunneling to eject electrons from said insulator.

26. The word line erase means of claim 24, wherein said electric field is of sufficient magnitude to inject holes into said trap sites.

27. A single cell erase means for a nonvolatile memory structured from twin MONOS memory cells, comprising:

a) a means for selecting a single cell of twin MONOS memory cells to be erased, b) a means for inhibiting from erase unselected twin MONOS memory cells, c) a means for creating an electric field under a control gate of said selected single cell of twin MONOS memory cells of sufficient magnitude to eject trapped electrons from an insulator into a channel region, d) a means for creating an electric field under said control gate of said single cell of twin MONOS memory cells of sufficient magnitude to inject holes into said insulator under the control gate.

28. The single cell erase means of claim 27, wherein said means for inhibiting from erase said twin MONOS memory cells is done by use of a positive control gate voltage on cells coupled to a selected word line.

29. The single cell erase means of claim 27, wherein said single twin MONOS memory cell comprises two memory storage sites contained in nitride sites located under each control gate.

30. A program disturb improvement means for a nonvolatile twin MONOS memory cell, comprising:

a) a means for selecting a twin MO NOS memory cell to be programmed, b) a means for biasing unselected twin MONOS memory cells to be program inhibited, c) a means for creating an electric field in a channel region near a storage site in an insulator under a control gate sufficient to reject electrons away from said storage site.

31. The program disturb improvement means of claim 30, wherein the means for creating the electric field in the channel region to reject electrons away from said storage site increases an amount of time needed to produce a program disturb and improves program disturb for short program operations.

32. The program disturb improvement means of claim 30, wherein the means for creating the electric field in the channel region to reject electrons away from said storage site is a result of a negative potential applied to unselected word lines.

* * * * *

UNITED STATES PATENT AND TRADEMARK OFFICE
CERTIFICATE OF CORRECTION

PATENT NO.      : 6,477,088 B2
DATED           : November 5, 2002
INVENTOR(S)     : Seiki Ogura, Tomoko Ogura and Tomoya Saito It is certified that error appears in the above-identified patent and that said Letters Patent is hereby corrected as shown below:

<u>Title page,</u>
Item [75], delete "Tomoya Saito, Tokyo (JP)", and replace with -- Tomoya Saito, Wappingers Falls, NY (US) --.

Signed and Sealed this

Eighteenth Day of March, 2003

JAMES E. ROGAN
*Director of the United States Patent and Trademark Office*